(12) United States Patent
Rieken

(10) Patent No.: US 8,928,170 B2
(45) Date of Patent: Jan. 6, 2015

(54) DIGITAL TWO WAY AUTOMATIC COMMUNICATION SYSTEM (TWACS) OUTBOUND RECEIVER AND METHOD

(75) Inventor: David W. Rieken, St. Peters, MO (US)

(73) Assignee: Aclara Technologies LLC, St. Louis, MO (US)

(*) Notice: Subject to any disclaimer, the term of this patent is extended or adjusted under 35 U.S.C. 154(b) by 530 days.

(21) Appl. No.: 13/205,355

(22) Filed: Aug. 8, 2011

(65) Prior Publication Data

US 2012/0039400 A1    Feb. 16, 2012

Related U.S. Application Data

(60) Provisional application No. 61/373,589, filed on Aug. 13, 2010.

(51) Int. Cl.

| | |
|---|---|
| *H04B 3/10* | (2006.01) |
| *H04L 25/00* | (2006.01) |
| *H04B 3/54* | (2006.01) |
| *H03L 7/08* | (2006.01) |
| *H04L 7/04* | (2006.01) |
| *H04L 25/03* | (2006.01) |
| *H04L 7/033* | (2006.01) |

(52) U.S. Cl.
CPC ............ *H04L 25/03159* (2013.01); *H04B 3/54* (2013.01); *H04L 2025/03356* (2013.01); *H04L 2025/0377* (2013.01); *H04B 2203/5416* (2013.01); *H03L 7/08* (2013.01); *H04L 7/033* (2013.01); *H04L 7/042* (2013.01)
USPC .................... 307/3; 307/1; 307/9.1; 375/147; 375/149; 375/260; 375/324; 375/326; 375/340; 375/355; 375/365; 375/368; 370/203; 370/206; 370/210; 370/211; 370/484

(58) Field of Classification Search
CPC ........................................................ H04B 3/00
USPC .......... 307/1–3, 9.1; 340/12.32; 370/203–211, 370/484; 375/147, 149, 260, 324, 326, 327, 375/340, 355, 365, 368
See application file for complete search history.

(56) References Cited

U.S. PATENT DOCUMENTS

| | | |
|---|---|---|
| 4,658,238 A | 4/1987 | Mak |
| 4,914,418 A | 4/1990 | Mak et al. |

(Continued)

FOREIGN PATENT DOCUMENTS

| | | |
|---|---|---|
| EP | 1039715 A1 * | 9/2000 |
| WO | 90/13950 | 11/1990 |

(Continued)

OTHER PUBLICATIONS

Rieken, David W., Maximum-Likelihood Estimation of the Frequency Response of a Low Frequency Power-Line Communication Channel, IEEE (2008), pp. 228-233.

(Continued)

*Primary Examiner* — Jared Fureman
*Assistant Examiner* — Carlos Laguerre
(74) *Attorney, Agent, or Firm* — Senniger Powers LLP

(57) ABSTRACT

A receiver and method for a transponder of a two-way automatic communications system (TWACS) used by an electrical utility in which analog outbound messages are sent from the utility to a consumer and inbound, reply messages are sent from the consumer to the utility. The receiver and method enable a transponder to detect the outbound messages and include A/D conversion and digital processing for demodulating a digitized signal and providing the outbound message.

25 Claims, 8 Drawing Sheets

(56) References Cited

U.S. PATENT DOCUMENTS

| | | | |
|---|---|---|---|
| 4,918,422 A | 4/1990 | Mak | |
| 4,963,853 A | 10/1990 | Mak | |
| 4,996,513 A | 2/1991 | Mak et al. | |
| 5,198,796 A | 3/1993 | Hessling, Jr. | |
| 5,202,903 A | 4/1993 | Okanoue | |
| 5,262,755 A | 11/1993 | Mak et al. | |
| 5,486,805 A | 1/1996 | Mak | |
| 5,617,084 A | 4/1997 | Sears | |
| 5,696,441 A | 12/1997 | Mak et al. | |
| 5,856,776 A | 1/1999 | Armstrong et al. | |
| 5,903,594 A | 5/1999 | Saulnier et al. | |
| 6,044,106 A | 3/2000 | Suzuki | |
| 6,172,597 B1 | 1/2001 | Brown | |
| 6,278,357 B1 | 8/2001 | Croushore et al. | |
| 6,356,555 B1 | 3/2002 | Rakib et al. | |
| 6,407,987 B1* | 6/2002 | Abraham | 370/295 |
| 6,940,396 B2 | 9/2005 | Hammond et al. | |
| 7,496,430 B2 | 2/2009 | Mak | |
| 7,593,378 B1* | 9/2009 | Murali et al. | 370/338 |
| 2002/0072879 A1 | 6/2002 | Sweitzer et al. | |
| 2002/0126741 A1 | 9/2002 | Baum et al. | |
| 2004/0100898 A1* | 5/2004 | Anim-Appiah et al. | 370/210 |
| 2004/0218699 A1* | 11/2004 | Carsello | 375/343 |
| 2004/0222698 A1 | 11/2004 | Hammond et al. | |
| 2005/0055586 A1* | 3/2005 | Flen et al. | 713/300 |
| 2007/0211401 A1 | 9/2007 | Mak | |
| 2008/0030265 A1 | 2/2008 | Ido et al. | |
| 2008/0273581 A1* | 11/2008 | Kodama et al. | 375/222 |
| 2009/0058728 A1 | 3/2009 | Mostafa et al. | |
| 2009/0257471 A1* | 10/2009 | Tanaka et al. | 375/130 |
| 2010/0124288 A1 | 5/2010 | Spencer et al. | |
| 2010/0172427 A1 | 7/2010 | Kleider et al. | |
| 2011/0007782 A1* | 1/2011 | Takahashi et al. | 375/149 |
| 2012/0039400 A1 | 2/2012 | Rieken | |
| 2014/0010271 A1 | 1/2014 | Rydstrom et al. | |

FOREIGN PATENT DOCUMENTS

| | | |
|---|---|---|
| WO | 98/40980 | 9/1998 |
| WO | 02/11309 A1 | 2/2002 |
| WO | 02/11386 A1 | 2/2002 |
| WO | 02/11387 A1 | 2/2002 |
| WO | 2008/134257 A1 | 11/2008 |
| WO | 2010/066289 A1 | 6/2010 |
| WO | 2012/021299 A1 | 2/2012 |

OTHER PUBLICATIONS

International Search Report dated Dec. 6, 2011 regarding PCT/US2011/045740, 3 pages.

Rieken, David W., Maximum-Likelihood Estimation of the Frequency Response of a Low Frequency Power-Line Communication Channel, IEEE Xplore, 2008, pp. 228-233.

* cited by examiner

DIGITAL TWO WAY AUTOMATIC COMMUNICATION SYSTEM (TWACS) OUTBOUND RECEIVER AND METHOD

BACKGROUND OF THE INVENTION

This invention relates to communications sent through a power distribution network and, more particularly, to a point-to-point communications system by which information is readily transmitted from any one location within the power distribution network to any other location within the network. Specifically, the present invention relates to digitally demodulating TWACS® (Two Way Automatic Communication System) outbound signals including outbound preamble detection.

Power line communications systems are known in the art. A typical system enables a utility to send messages over its power line to or from a central location such as a substation to most, if not all, of its customers connected to that site. The messages involve such things as current electrical usage at the customer's site, polling requests to determine whether or not an outage has occurred within a service area, or commands to reduce or shut-off the amount of power provided to a load at the customer's site during periods of peak electrical usage. Replies received from the various locations to which messages are sent enable the utility to determine its current operational status, as well as changes that may need to be made to reconfigure the power distribution system for changes (or prospective changes) in its operating circumstances.

Electrical usage has grown significantly in recent years so that, over time, the demands placed on utilities have greatly increased and many utilities are now hard pressed to maintain adequate levels of service to their customers. Similarly, the demands placed on current communications systems employed by these utilities to support their operations have also greatly increased to the point where it has become difficult for these systems to timely provide the information necessary for the utility to operate at the level at which it needs to operate. For example, the amount of information required by the utility, on an almost continuous basis, has expanded to the point where the information throughput (data transmission rates) required of communications systems is at, or near the limits of the communications system's capabilities.

TWACS outbound signals have been decoded using comparators and timers. In this way the digital processor is supplied a sequence of times at which the incident signal has taken on known values. This has the advantage of not requiring expensive hardware.

The present analog outbound receiver requires a large signal-to-noise ratio (SNR) in order to maintain a reasonable bit error ratio. It is designed to work with a specific outbound signal constellation. This constellation contains only two signals, each with a duration of two complete mains cycles. Thus, the data rate is only 1 bit every 1/30 seconds, or 30 bps. This constellation size can be increased to as many as 16 symbols for this signal duration, so that up to 4 bits may be transmitted every 2 cycles giving a maximum data rate of 120 bps. However, adapting the present receiver to the new constellation would be difficult if not impossible.

There is a need for an outbound receiver using analog-to-digital conversion that could be adapted to the new constellation and which could be implemented on general purpose microprocessors.

SUMMARY OF THE INVENTION

In one form, the invention comprises a receiver for a two-way automatic communications system (TWACS) used by an electrical utility in which outbound messages are sent from the utility to a consumer and inbound messages are sent from the consumer to the utility. The respective outbound and inbound messages are sent and received over the utility's power distribution system. The receiver detects the outbound messages and comprises an analog filter, an A/D converter and a digital processor. The analog filter component receives the analog outbound signal (AOS) r(t) including an outbound message ($\hat{m}$) to provide a filtered signal. The A/D converter converts the filtered signal to a corresponding digitized signal and provides the corresponding digitized signal. The digital processor executes a digital preprocessor component for receiving the corresponding digitized signal and for preprocessing the received corresponding digitized signal to provide a preprocessed digital signal z[k]. The processor also executes a digital symbol determination component for receiving the preprocessed digital signal z[k] and for digitally demodulating the received preprocessed digital signal z[k] to provide the outbound message ($\hat{m}$).

In another form, the invention comprises a two-way automatic communications system (TWACS) used by an electrical utility including a substation sending analog outbound messages from the utility to a consumer, a transceiver sending inbound messages from the consumer to the utility, and a receiver included in the transceiver for enabling the detection of the outbound messages. The receiver comprises an analog filter component, an A/D converter and a digital processor executing a digital preprocessor component and a digital symbol determination component.

In another form, the invention comprises a method in a two-way automatic communications system (TWACS) used by an electrical utility in which analog outbound messages are sent from the utility to a consumer and inbound messages are sent from the consumer to the utility, the respective outbound and inbound messages being sent and received over the utility's power distribution system. The method detects the outbound messages and comprises:

- receiving the analog outbound signal including an outbound message;
- converting the received analog outbound signal to a corresponding digitized signal;
- preprocessing the corresponding digitized signal to provide a preprocessed digital signal; and
- digitally demodulating the preprocessed digital signal to provide the outbound message.

Other objects and features will be in part apparent and in part pointed out hereinafter.

BRIEF DESCRIPTION OF THE DRAWINGS

FIG. 1 illustrates the outbound receiver on the LV (low voltage) side of the distribution transformer. It is also contemplated that the receiver may be placed instead or additionally on the MV (medium voltage) side (not illustrated in FIG. 1).

Corresponding reference characters indicate corresponding parts throughout the drawings.

DESCRIPTION OF THE PREFERRED EMBODIMENTS

Figure 1:
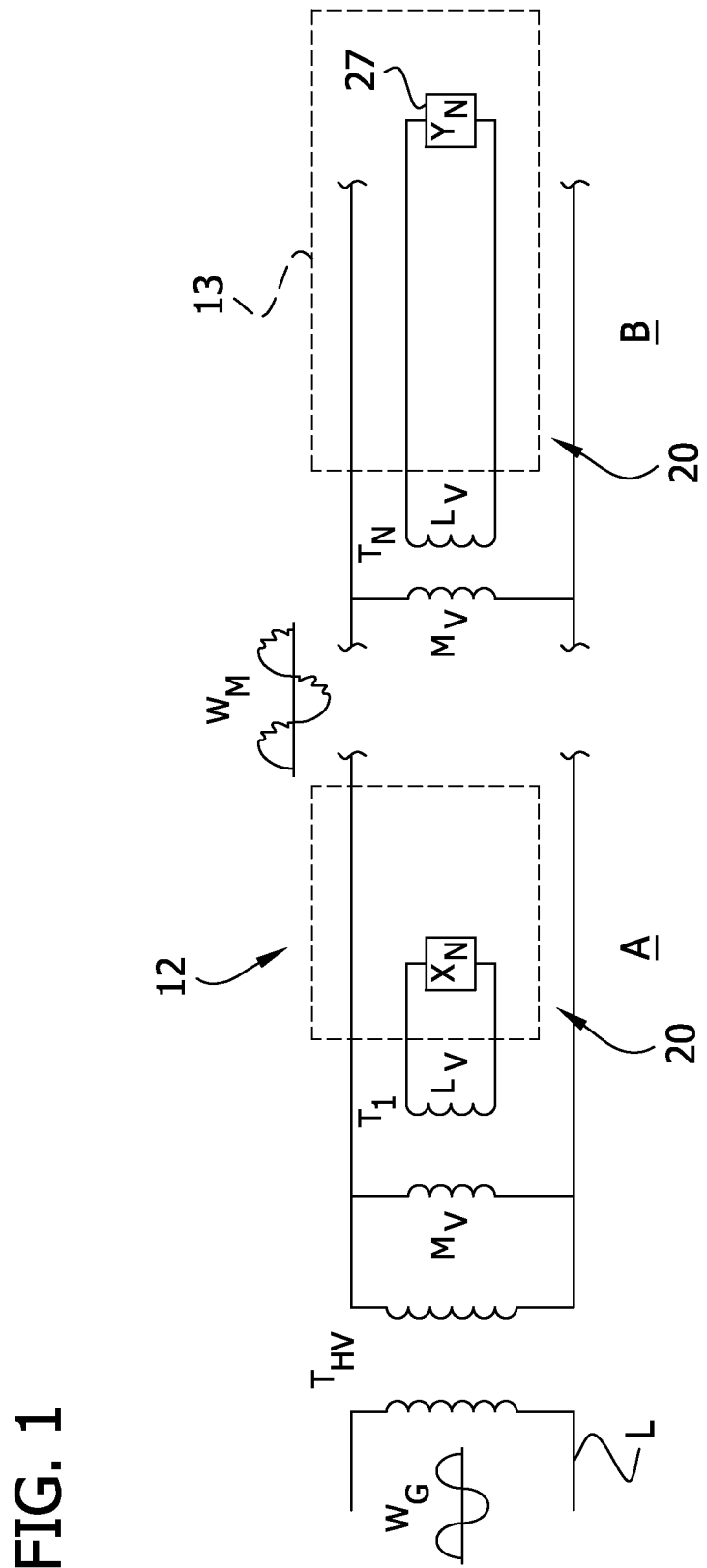
FIG. 1 is a simplified schematic of a point-to-point communications system incorporated into a utility's power distribution network. The box labeled $X_N$ represents one of a plurality of outbound signal transmitters. The box labeled $Y_N$ represents one of a plurality of outbound receivers.

As shown in FIG. 1, a point-to-point communications system 20 enables messages to be transmitted from any one location A within the power distribution system to any other location B within the system. Typically, messages are sent from a substation to one or more of the facilities and a reply message is separately sent from each facility back to the substation. It is a feature of the present invention, however, that a message can be sent from locations other than a substation to any other location (which could be, but is not necessarily a substation) within communications system 20.

As shown in FIG. 1, a voltage waveform $W_G$ generated or propagated by the utility (i.e., the mains signal) is impressed across the primary windings of a high voltage transformer $T_{HV}$. Waveform $W_G$ is typically a 3 phase, usually between 35 KVAC and 160 KVAC, 60 Hz waveform; although it will be understood by those skilled in the art that communications system 20 works equally as well with other utility generated waveforms, for example, 50 Hz waveforms generated by utilities in many countries.

The secondary windings of transformer $T_{HV}$ are, in turn, connected across the primary windings of transformers $T_1$-$T_N$. A transmitter $X_N$ of a transceiver indicated generally 12 is connected across the secondary or low voltage windings LV of transformer $T_1$ at a location A. At a location B, a transceiver 13 includes a receiver $Y_N$ connected to the power line for receiving and processing messages sent over the communications system 20.

Figure 2:
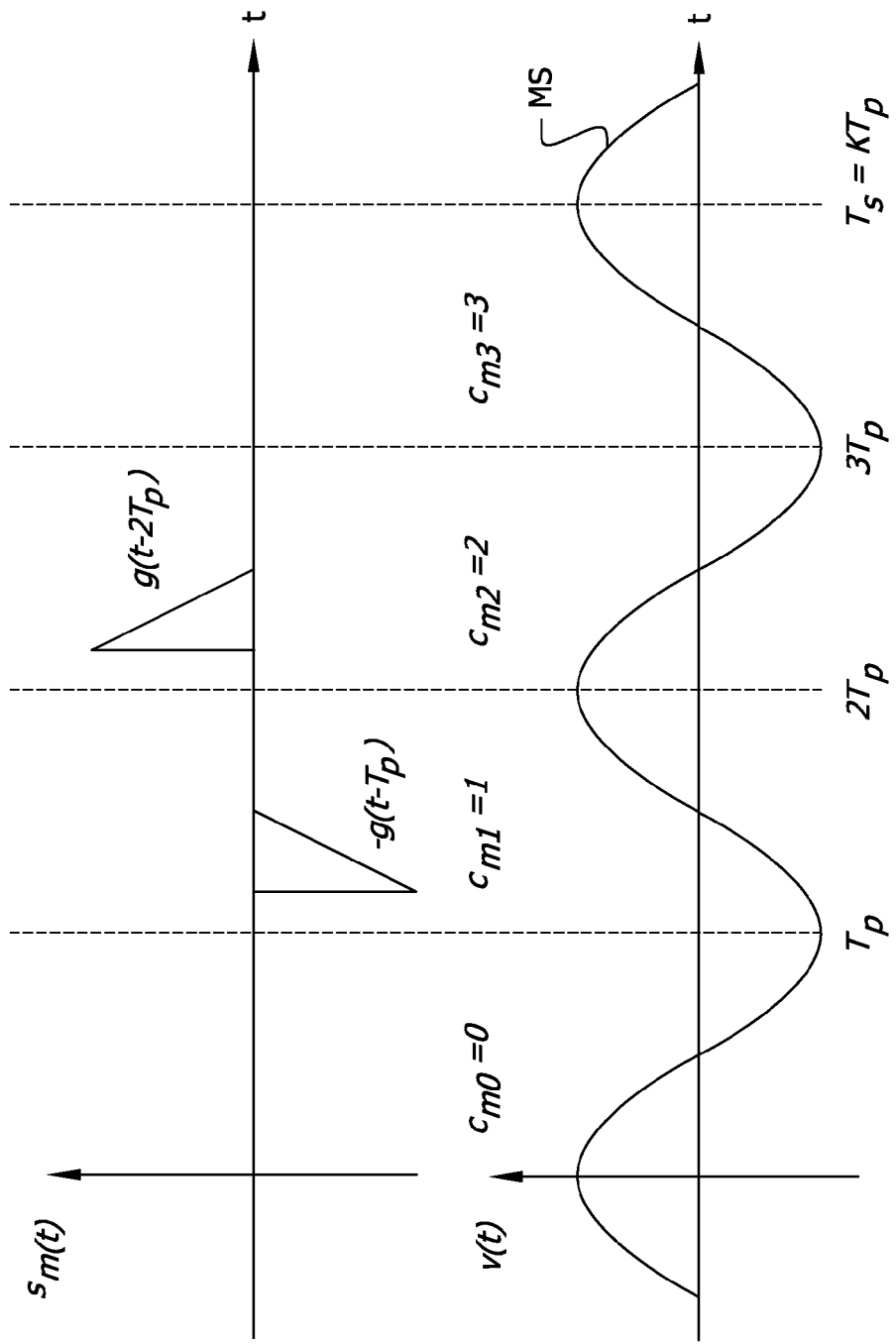
FIG. 2 is a waveform diagram illustrating one embodiment of an outbound TWACS (Two Way Automatic Communication System) signal, which is digitally demodulated by a receiver and method of the invention.

A signal waveform $W_M$ shown in FIG. 1 represents the waveform $W_G$ including a modulated message added by transceiver 12 for receiving and decoding by transceiver 13. TWACS transmissions are phase-locked to the mains signal MS as shown in FIG. 2. In any given half-cycle of this signal the transmitter has the option to fire its signal. The resulting current may be represented by the function g(t). The inbound and outbound signal constellation for any TWACS transmission is then summarized by the equation $$s_m(t) = \sum_{k=0}^{K-1} c_{mk}(-1)^k g(t-kT_p) \tag{1.1.1}$$

where $c_{mk} \in \{0,1\}$, g(t) is the TWACS pulse with support on [0, $T_p$], $T_p$ is the duration of one half-cycle, and K is the signal duration in half-cycles. $c_{mk}=1$ indicates that the firing element is active during the kth half-cycle of the mth symbol, where $c_{mk}=0$ indicates that the element has not fired. g(t) is therefore the signal generated by the element firing.

Figure 4:
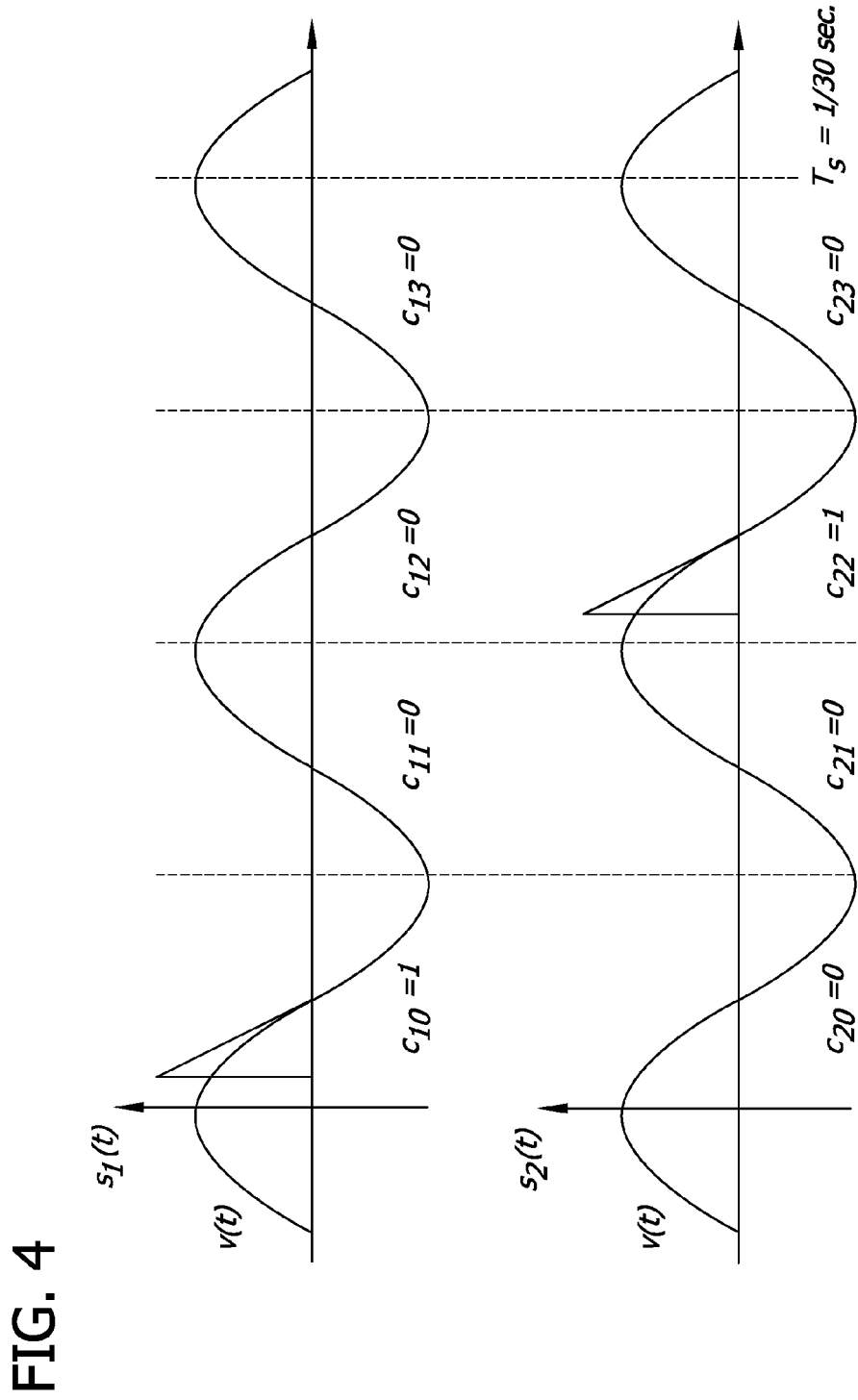
FIG. 4 is a waveform diagram illustrating one embodiment of a 30 bps TWACS outbound signal set.

Outbound TWACS uses binary signaling with four half-cycle symbol lengths. The constellation is depicted in FIG. 4 where $s_1(t)$ and $s_2(t)$ correspond to binary 1 and 0, respectively. Thus, each symbol may be represented using (1.1.1) where $$c_1 = [1\ 0\ 0\ 0]^T$$

$$c_2 = [0\ 0\ 1\ 0]^T \tag{2.1.1}$$

Code division multiple access (CDMA), although not frequently used explicitly for outbound TWACS signaling, is frequently used for inbound TWACS signaling.

According to one embodiment, the invention comprises a digital implementation of an additive white Gaussian noise (AWGN) receiver including a processor executing an algorithm for preamble detection and an algorithm for phase locking to the mains signal.

A receiver for dealing with AWGN is given by the following:

$$-r_0 + r_2 \underset{\hat{m}=2}{\overset{\hat{m}=1}{\lessgtr}} 0 \tag{2.1.2}$$

The receiver statistic $r_k$ in (2.1.2) is the integral $$r_k = \frac{1}{\sqrt{E_g}} \int_0^{T_s} r(t)g(t-kT_p)dt \tag{2.1.3}$$

$$= \frac{1}{\sqrt{E_g}} \int_{kT_p}^{T_s-kT_p} r(\tau+kT_p)g(\tau)d\tau.$$

But since g(t) has support only on the interval $[0,T_p]$ $$r_k = \frac{1}{\sqrt{E_g}} \int_0^{T_p} r(\tau-kT_p)g(\tau)d\tau \tag{2.1.4}$$

$$= \frac{1}{\sqrt{E_g}} \langle r_k(t), g(t) \rangle$$

Where we have defined a new signal $$r_k(t) = \begin{cases} r(t+kT_p), & t \in [0, T_p] \\ 0, & \text{else} \end{cases} \tag{2.1.5}$$

where r(t) is the received signal.

Figure 3:
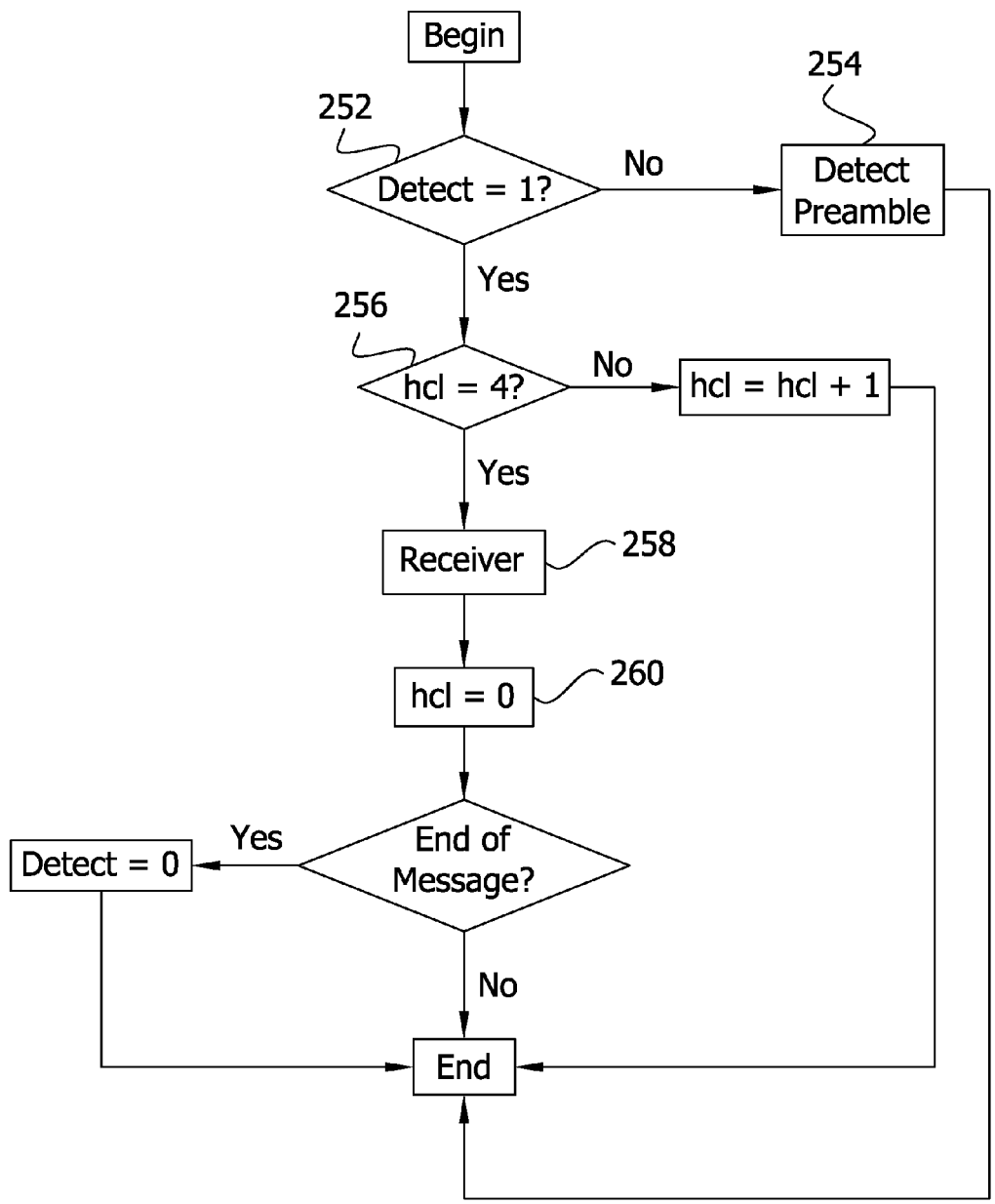
FIG. 3 is a flow chart detailing the interaction between the preamble detector and the receiver.

FIG. 3 is a flow chart detailing the interaction between the preamble detector and the receiver. The preamble detection algorithm according to the embodiment illustrated in FIG. 3 lends itself to noise covariance matrix estimation, which can, in turn, be used to increase the fidelity of the receiver. One embodiment of a system for performing this computation is demonstrated in FIG. 5. At 252, digital processor 200 checks the detect flag (set in the detect preamble routine to reflect the detection of a preamble sequence). If this is false, the preamble detection algorithm is executed at 254. If true, a half cycle counter hcl is checked at 256. If not equal to 4, a count is added. If equal to 4, the signal is processed (received) at 258 by the digital processor 200 and the hcl count is reset to zero at 260. At the end of the message, the detect counter is set to zero at 262, thus ending the receiving process and enabling preamble detection once more.

Computing $r_k$ is explained above; $r_k$ is the inner product of the received signal with the signal waveform $g(t-kT_p)$. For frequency-selective channels, this must be the TWACS signal as seen by the receiver. That is, it is the transmitted pulse operated on by the channel. The system in FIG. 5 estimates the received pulse, as well as computing the necessary inner product.

We will call $r_k(t)$ the kth half-cycle snapshot since it is the signal received during one half-cycle of the mains. If we let $r_{k+}(t)$ be the analytic function of $r_k(t)$ (2.1.4) becomes $$r_k = \frac{1}{\sqrt{E_g}} \langle r_k(t) + r_k^*+(t), g(t) \rangle \qquad (2.1.6)$$

$$= \frac{1}{\sqrt{E_g}} \langle r_k+(t), g(t) \rangle + \langle r_k^*+(t), g(t) \rangle$$

$$= \frac{1}{\sqrt{E_g}} \langle r_k+(t), g(t) \rangle + \langle r_k+(t), g(t) \rangle^*$$

$$= \frac{2}{\sqrt{E_g}} \mathrm{Re}\{\langle r_k+(t), g(t) \rangle\}$$

Where we have used the fact that g(t) is a real signal. By Parseval's theorem (2.1.6) is $$r_k = \frac{2}{\sqrt{E_g}} \mathrm{Re}\{\langle R_k+(f), G(f) \rangle\} \qquad (2.1.7)$$

Where $R_{k+}(f)$ and G(f) are the Fourier transforms of $r_{k+}(t)$ and g(t) respectively. The revised expression for the AWGN receiver is found by substitution of (2.1.7) for k=0 and k=2 into (2.1.2):

$$-\frac{2}{\sqrt{E_g}}\mathrm{Re}\{\langle R_0+(f), G(f)\rangle\} + \frac{2}{\sqrt{E_g}}\mathrm{Re}\{\langle R_{2+}(f), G(f)\rangle\} \overset{\hat{m}=2}{\underset{\hat{m}=1}{\lessgtr}} 0 \qquad (2.1.8)$$

$$\mathrm{Re}\{\langle -R_0+(f) + R_{2+}(f), G(f)\rangle\} \overset{\hat{m}=2}{\underset{\hat{m}=1}{\lessgtr}} 0$$

Where the summation over k has been strategically placed inside the inner product. (2.1.8) is what must be computed in the receiver. We shall shift our focus now to how that is done.

Figure 5:
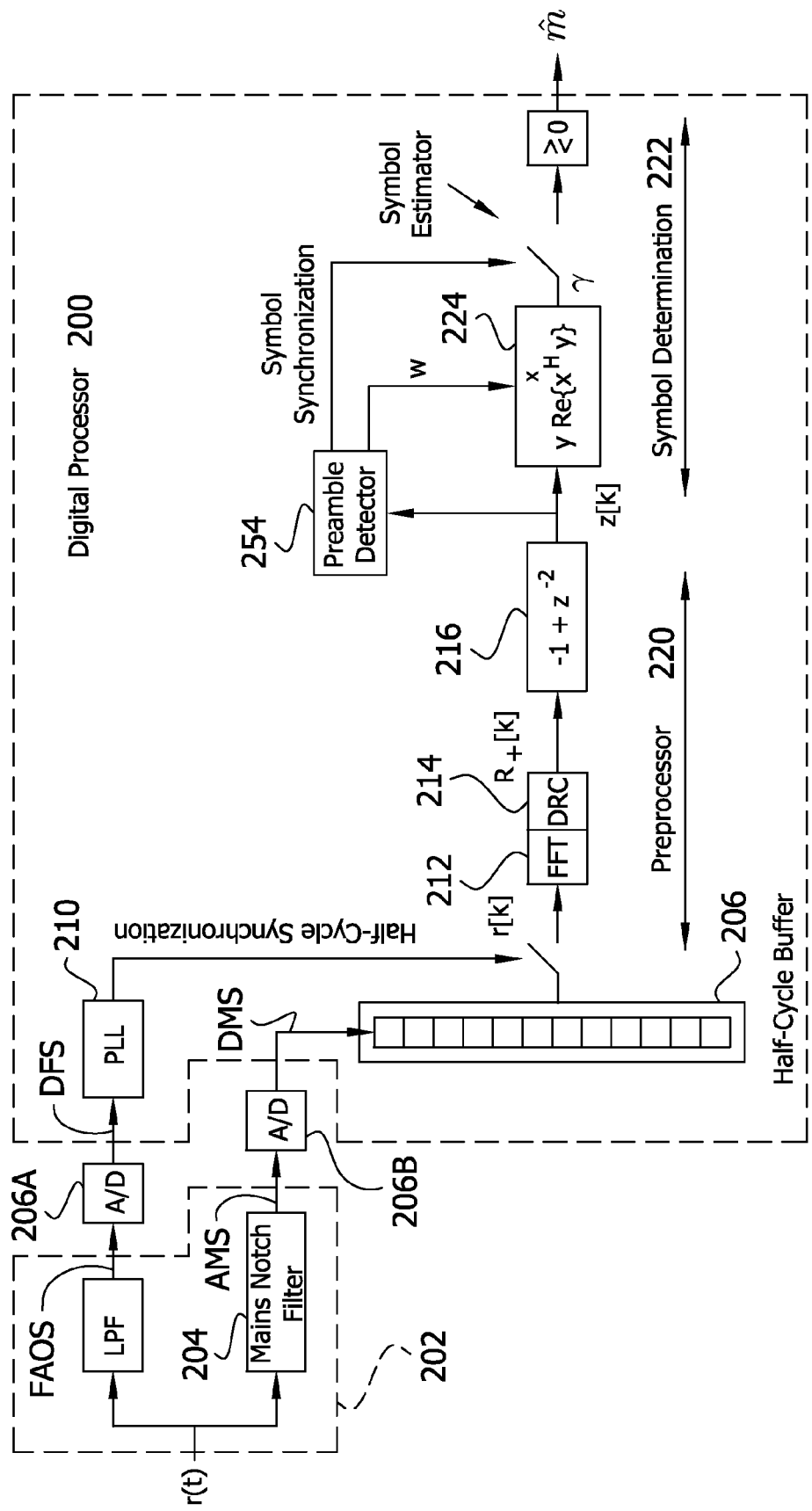
FIG. 5 is a block diagram of one embodiment of a receiver according to the invention.

Referring again to the block diagram in FIG. 5, the received signal, r(t), is operated on by a filter component 202 including a mains notch filter 204 to cancel out the 60 Hz (or 50 Hz) mains signal to provide an analog message signal (AMS). This is done to reduce the signal dynamic range and reduce quantization noise in the subsequent A/D conversion. The AMS is digitally sampled by A/D converter 206B to provide a digital message signal (DMS) stored in a FIFO buffer 206 large enough to accommodate at least one mains half-cycle worth of data. The received signal r(t) is also low-pass filtered (LPF) prior to digitizing by A/D converter 206A so that the mains signal is tracked without aliasing. The filtered analog outbound signal (FAOS) is converted by the A/D converter 206A to a digitized filtered signal (DFS). The DFS is provided to a digital phase-locked loop (PLL) 210 which tracks the mains signal and provides half-cycle synchronization. The converters 206 may be part of the digital processor 200 or separate components. When a half-cycle boundary occurs, as illustrated by dotted lines in FIG. 4, the contents of the FIFO buffer are passed to the next stage of the algorithm as a column vector:

$$r[k] = \begin{bmatrix} r_k(0) \\ r_k(T_\Delta) \\ * \\ * \\ * \\ r_k((N-1)T_\Delta) \end{bmatrix} \qquad (2.1.9)$$

where $T_\Delta$ is the sample time and N is the half-cycle snapshot length.

Equation (2.1.8) requires half-cycle snapshots to be in the frequency domain. Thus, this column vector is operated on by an FFT 212. Since only the Fourier transform of the analytic function, $R_{k+}(f)$ is required, half of the output of the FFT may be discarded. In practice, many more than that may be discarded, provided the signal is sufficiently narrowband.

The FFT is used with a dimension reducing component DRC 214 for reducing the dimensionality of the vector prior to computing its inner product. The DRC eliminates unwanted signal components. Most of the elements of the vector output of the FFT can be discarded since the transmitted signal g(t) is bandlimited. Those elements not discarded should collectively represent that portion of the spectrum in which the SNR is significant. The resulting complex column vector, $R_+[k]$, is a discretization of $R_{k+}(f)$. With this discretization algorithm in place the receiver equation (2.1.8) is approximated by the matrix equation $$\mathrm{Re}\{(-R_+[k] + R_+[k-2])^H G\} \overset{\hat{m}=2}{\underset{\hat{m}=1}{\lessgtr}} 0. \qquad (2.1.10)$$

G is a vectorization of the signal G(f) in the same way that $R_+[k]$ is a vectorization of the signal $R_{+k}(f)$. An estimate of G is provided by the preamble detection algorithm (see FIG. 3). Note that in FIG. 5 the preamble detector output is denoted w rather than $\hat{G}$. As noted below, the weight vector returned by the preamble detector may implement adaptive equalization. Also, as shown in FIG. 5 the sum $-R+[k]+R+[k-2]$ is computed using the FIR filter $[-1+z-2]$. The output of this is fed to the inner product calculator. The preamble detector also provides symbol synchronization information as described by FIG. 3. The synchronized stream is compared to 0 to determine the transmitted symbol.

The receiver 258 implements the following equation using the weight vector provided by the preamble detector:

$$\gamma = \mathrm{Re}\{w^H z[k]\}$$

The bit estimate is obtained by thresholding this scalar:

$$\hat{m}(l) = \begin{cases} 1 & \text{if } \gamma > 0 \\ 0 & \text{else} \end{cases}$$

The length field encodes the length of the variable fields of the outbound packet. The total length in bits is then an affine function of the value encoded in the length field. Prior to reading this field the length is set to a default value which should represent a maximum length. After the number of symbols retrieved corresponds to length the receiver is reset to search for preambles once more.

Preamble Detector

In summary, the digital processor 200 executes a digital preprocessor component 220 receiving the corresponding digitized signal r[k] and preprocessing the received corresponding digitized signal to provide a preprocessed digital signal z[k]. The processor 200 also executes a digital symbol determination component 222 receiving the preprocessed digital signal z[k] and digitally demodulating the received preprocessed digital signal z[k] to provide the outbound message ($\hat{m}$). The symbol determination component 222 includes the preamble detector 254 which provides a weight vector w to a digital symbol estimation component 224 generating a noise product signal γ which is selectively sampled by the synchronization signal to provide the outbound message ($\hat{m}$).

A filtered preamble sequence (see detect preamble 254 in FIG. 3) is formed:

$$\hat{q}^{(0)}[k] \leftarrow (-p_k + p_{k-2})(-1)^k \quad (2.1.11)$$

Figure 6:
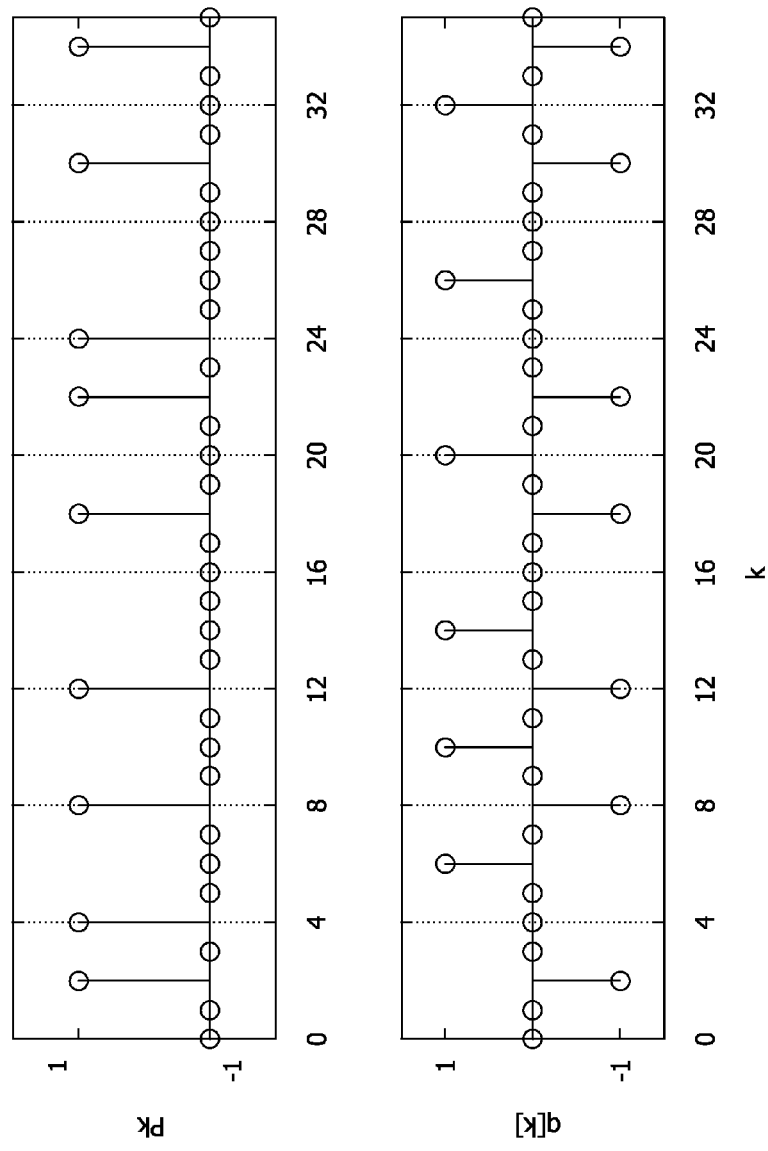
FIG. 6 illustrates unfiltered preamble coefficients $P_k$ as seen at the output of the FFT of FIG. 5 and filtered preamble coefficients q[k] as seen at the output of FIR filter $-1+z^{-2}$ of FIG. 5.

FIG. 6 illustrates unfiltered preamble coefficients $P_k$ as seen at the output of the FFT of FIG. 5 and filtered preamble coefficients q[k] as seen at the output of FIR filter 216 ($-1+z^{-2}$) of FIG. 5.

The received symbols $\hat{G}^{(n)}$ and steering vector $\hat{q}^{(n)}$ are estimated iteratively, using the following algorithm:

for n = 1 to N do $$\hat{G}^{(n)} \leftarrow \frac{\sum_{k=0}^{K-1} \hat{q}^{(n-1)}[k]z[k]}{\sum_{k=0}^{K-1} |\hat{q}^{(0)}[k]|^2}$$

$$\hat{q}^{(n)}[k] \leftarrow \frac{(\hat{G}^{(n)})^H z[k]}{(\hat{G}^{(n)})^H \hat{G}^{(N)}}$$

end for

Next, the symbols are thresholded using:

$$q'[k] = \begin{cases} -1, & \hat{q}^{(N)}[k] < -0.5 \\ 0, & -0.5 < \hat{q}^{(N)}[k] < 0.5 \\ 1, & \hat{q}^{(N)}[k] > 0.5 \end{cases}$$

The resulting sequence is compared to the sequence in (2.1.11). If there are fewer than M errors, then detect is set to 1.

If optional adaptive equalization is not used, the weight vector is set to:

$$w = \hat{G}^{(N)}$$

To implement adaptive equalization, the noise covariance matrix, S, is estimated using equation 2.3.1:

$$\hat{S} = \frac{1}{|K_0|} \sum_{k \in K_0} z[k]z^H[k] \quad (2.3.1)$$

where k ∈ $K_o$ if q[k]=0.

The weight vector returned is then:

$$w = S^{-1}\hat{G}^{(N)}$$

Phased Lock Loop (PLL)

Figure 7:
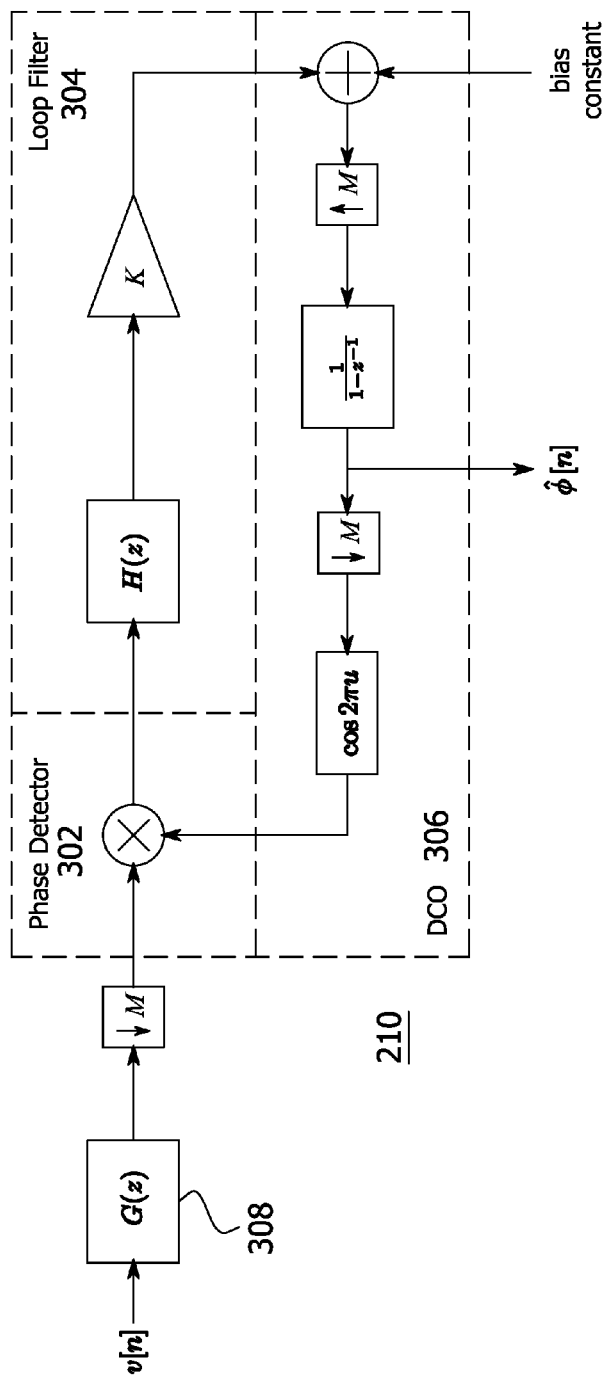
FIG. 7 illustrates a block diagram of one embodiment of the digital phase locked loop (PLL) of FIG. 5.
Figure 8:
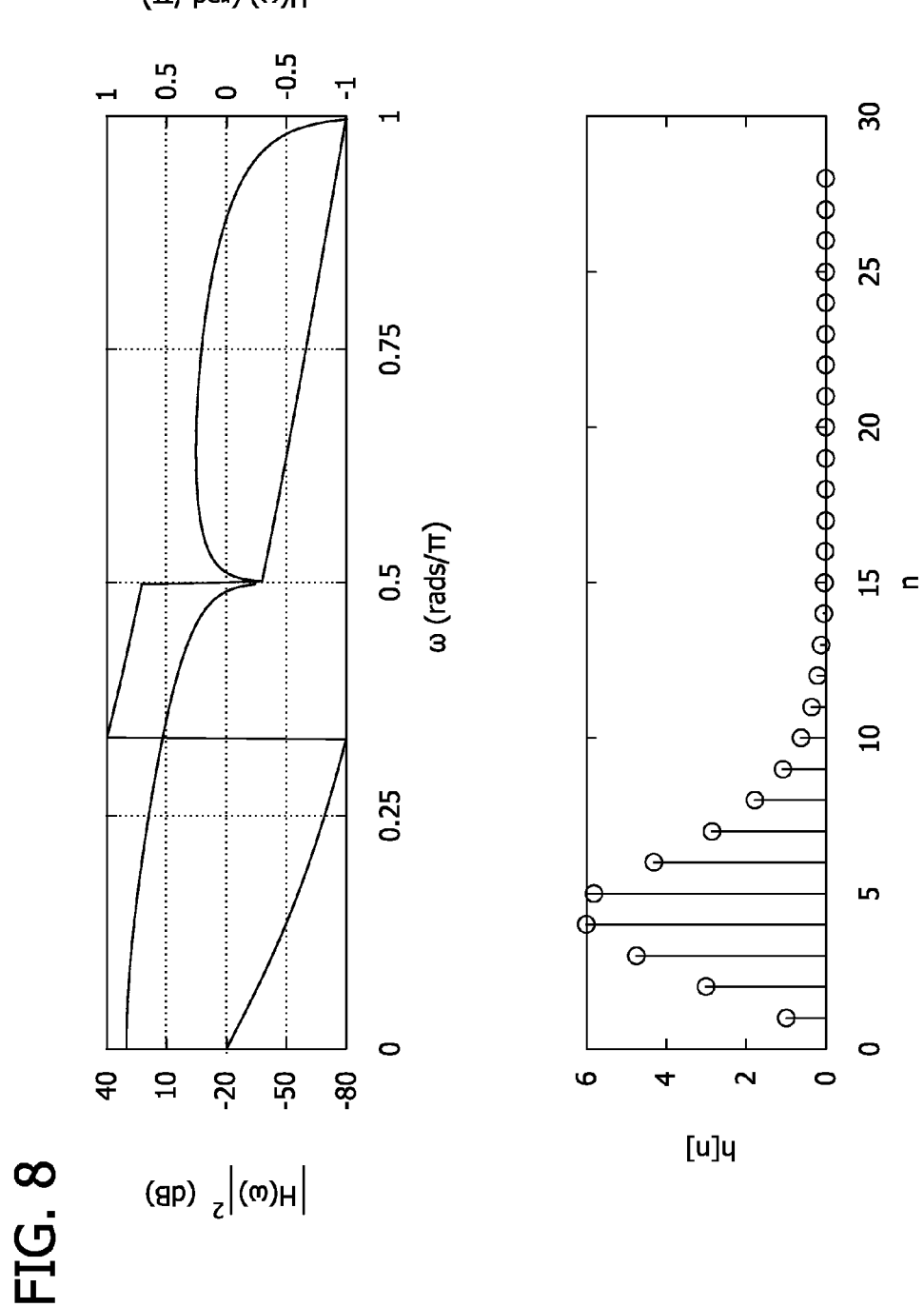
FIG. 8 illustrates one embodiment of the frequency and impulse response of the loop filter H(z) of the digital PLL of FIG. 7.

FIG. 7 illustrates a block diagram of one embodiment of the digital phase locked loop (PLL) 210 of FIG. 5. FIG. 8 illustrates one embodiment of the frequency and impulse response of the loop filter H(z) of the digital PLL of FIG. 7.

A precision phase-locked loop (PLL) 210 locking the receiver to the mains signal is a part of the receiver illustrated in FIG. 5. Zero-crossing detection is one way of doing this, but is sensitive to noise. Doing so would require some kind of jitter mitigation algorithm. Since the ratio of the mains signal power to the noise power is so high, a digital version of an analog phase locked loop may be used. This algorithm is illustrated in the block diagram of FIG. 7. The loop consists of a phase detector 302, a loop filter 304, a digitally controlled oscillator 306, and an anti-aliasing filter 308.

The phase-locked loop 210 is designed for digital signals in which the lock-on component is at or very near a digital frequency of π/2. This requires a sampling rate four times the mains frequency, but in practice signals are sampled at much higher frequencies. FIG. 7 illustrates several decimation blocks for downsampling to this lower frequency. If, for example, for inputs v[n] sampled at 12 KHz, operating on 60 Hz power systems, M equals 50. For sampling rates of 12.5 KHz, M equals 52. For 12 KHz sampling rates operating on 50 Hz power systems, M equals 60.

In general, the mains signal is not simply a sinusoid. G(z) is an anti-aliasing filter 308 whose purpose is to eliminate power system harmonics which would otherwise be aliased into the low-rate digital signal fed to the PLL. If the principal component after downsampling is at digital frequency π/4, then it is only necessary to attenuate harmonics 3 and above. A low pass filter (LPF) with a transition region between 70 and 170 Hz (on 60 Hz power systems) is one option. The signal amplitude must be between −1 and 1. The filter gain should be set accordingly. Optionally, an adaptive gain control stage that adapts to the mains signal strength may be inserted. The amplitude of the signal fed to the mixer is critical when considering lock-in and hold-in range.

The digitally controlled oscillator (DCO) 306 generates a sinusoid with a frequency that is an affine function of the input from the loop filter. However, the estimate of the mains phase, $\hat{\phi}[n]$, is provided at the same sampling frequency as the mains signal v[n]. If the input to the DCO is a constant $x_0$, then the phase estimate is $$\hat{\Phi}(z) = \frac{1}{1-z^{-1}}(x_0 \mid k) \quad (2.4.1)$$

Where k is the bias constant. In the time domain $$\hat{\phi}[n] = \hat{\phi}[n-1] + x_0 + k \quad (2.4.2)$$

$$\hat{\phi}[n] = n(x_0 + k). \quad (2.4.3)$$

So the DCO sends this signal to the phase detector:

$$y[n] = \cos(2\pi n(x_0 + k)). \quad (2.4.4)$$

The bias constant k must be set so that when the input x0=0 the DCO sends a sinusoid with the mains frequency to the phase detector. Thus $$k = \frac{f_0}{F_s} \qquad (2.4.5)$$

where $f_0$ is the mains frequency and $F_s$ is the sampling rate of v[n].

The phase detector 302 output will consist of the actual phase estimate with a frequency near 0 and nuisance components with frequencies near $\pm\pi$. There may also be components with frequency near $\pm\pi/2$ resulting from the mains harmonics. The loop filter exists to remove all but the phase estimate. Thus, zeros are placed at $z=\pm j$ and $z=-1$ to mitigate harmonic output from the phase detector arising from the 0th and 2nd mains harmonics, which pass through the anti-aliasing filter. Poles are placed at $z=0.5$ to increase gain at low frequencies. However, care must be taken not to make the phase slope too steep. Analyses have suggested that hold-in range degrades as the filter delay increases.

The filter is an IIR filter of the form $$H(z) = \frac{\sum_n b_n z^{-n}}{\sum_n a_n z^{-n}}$$

having the coefficients as shown in Table 1, below.

TABLE 1

Filter Coefficients

| | \multicolumn{5}{c|}{n} |
|---|---|---|---|---|---|
| | 0 | 1 | 2 | 3 | 4 |
| $a_n$ | 1 | −1 | 0.25 | 0 | 0 |
| $b_n$ | 1 | 2 | 2 | 2 | 1 |

Notice that all the filter coefficients are powers of 2. This has the potential of simplifying implementation since each multiplication is a simple bit shift. The resulting filter characteristics are illustrated in FIG. 8.

The loop gain, K, affects the lock-in range and the hold-in range. The choice of filter gain affects the hold-in range of the PLL and the phase accuracy. In general, increasing K increases the hold-in range but also increases phase estimate accuracy. Increasing K beyond about $2^{-13}$ will cause the loop to abruptly stop functioning altogether.

For purposes of illustration, programs and other executable program components, such as the operating system, are illustrated herein as discrete blocks. It is recognized, however, that such programs and components reside at various times in different storage components of the computer, and are executed by the data processor(s) of the computer.

Although described in connection with an exemplary computing system environment, embodiments of the invention are operational with numerous other general purpose or special purpose computing system environments or configurations. The computing system environment is not intended to suggest any limitation as to the scope of use or functionality of any aspect of the invention. Moreover, the computing system environment should not be interpreted as having any dependency or requirement relating to any one or combination of components illustrated in the exemplary operating environment. Examples of well known computing systems, environments, and/or configurations that may be suitable for use with aspects of the invention include, but are not limited to, personal computers, server computers, hand-held or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the invention may be described in the general context of components, data and/or computer-executable instructions, such as program modules, stored one or more tangible non-transitory computer storage media and executed by one or more computers or other devices. Generally, program modules include, but are not limited to, routines, programs, objects, components, and data structures that perform particular tasks or implement particular abstract data types. Aspects of the invention may also be practiced in distributed computing environments where tasks are performed by remote processing devices that are linked through a communications network. In a distributed computing environment, program modules may be located in both local and remote computer storage media including memory storage devices.

In operation, computers and/or servers may execute the computer-executable instructions such as those illustrated herein to implement aspects of the invention.

The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Embodiments of the invention may be implemented with computer-executable instructions. The computer-executable instructions may be organized into one or more computer-executable components or modules on a tangible computer readable storage medium. Aspects of the invention may be implemented with any number and organization of such components or modules. For example, aspects of the invention are not limited to the specific computer-executable instructions or the specific components or modules illustrated in the figures and described herein. Other embodiments of the invention may include different computer-executable instructions or components having more or less functionality than illustrated and described herein.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

In view of the above, it will be seen that several advantages of the invention are achieved and other advantageous results attained.

Not all of the depicted components illustrated or described may be required. In addition, some implementations and embodiments may include additional components. Variations in the arrangement and type of the components may be made without departing from the spirit or scope of the claims as set forth herein. Additional, different or fewer components may be provided and components may be combined. Alternatively or in addition, a component may be implemented by several components.

Having described aspects of the invention in detail, it will be apparent that modifications and variations are possible without departing from the scope of aspects of the invention as defined in the appended claims. As various changes could be made in the above constructions, products, and methods without departing from the scope of aspects of the invention, it is intended that all matter contained in the above description and shown in the accompanying drawings shall be interpreted as illustrative and not in a limiting sense.

What is claimed is:

1. In a two-way automatic communications system (TWACS) used by an electrical utility in which outbound messages are sent from the utility to a consumer and inbound messages are sent from the consumer to the utility, the respective outbound and inbound messages being sent and received over the utility's power distribution system, a receiver for detecting the outbound messages, said receiver comprising:
an analog filter component receiving the analog outbound signal including an outbound message to provide a filtered signal,
an A/D converter component converting the filtered signal to a corresponding digital signal and providing the corresponding digital signal; and
a digital processor executing:
a digital preprocessor component receiving the corresponding digital signal, preprocessing the received corresponding digital signal to provide a preprocessed discretization digital signal; and
a digital symbol determination component receiving the preprocessed discretization digital signal and providing a noise product signal, said digital symbol determination component including a preamble detector providing a symbol synchronization signal corresponding to the preprocessed discretization digital signal, said digital symbol determination component digitally demodulating the received preprocessed discretization digital signal by sampling according to the symbol synchronization signal and according to the noise product signal to provide the outbound message.

2. The receiver of claim 1 wherein the filter component comprises:
a carrier notch filter receiving the analog outbound signal and canceling the carrier signal to provide an analog message signal; and
a low-pass filter (LPF) component receiving the analog outbound signal and filtering the analog outbound signal to provide a filtered analog outbound signal;
and wherein the A/D converter component comprises:
a first A/D converter digitizing the analog message signal into a digital message signal; and
a second A/D converter digitizing the filtered analog outbound signal and providing a digital filtered signal.

3. The receiver of claim 2 wherein the digital processor includes a buffering component comprising:
a buffer receiving the digital message signal and sequentially providing a half-cycle buffered signal corresponding thereto, and
a phase locked loop (PLL) component receiving the digital filtered signal and providing a half-cycle synchronization signal corresponding thereto, said half-cycle synchronization signal sampling the half-cycle buffered signal to provide a corresponding digital signal.

4. The receiver of claim 3 wherein the digital preprocessor component comprises:
a fast Fourier transform (FFT) component receiving the corresponding digital signal and providing a frequency domain signal corresponding to the digital signal; and
a dimension reduction component connected to the FFT component for receiving the frequency domain signal, said dimension reduction component providing the preprocessed discretization digital signal corresponding to the received corresponding digital signal.

5. The receiver of claim 4 further comprising a finite impulse response (FIR) digital filter receiving the preprocessed discretization digital signal from the dimension reduction component and filtering the preprocessed discretization digital signal to provide the filtered digital signal to the digital symbol determination component wherein the frequency domain signal provided by the dimension reduction component to the FIR filter includes only frequency bands with a signal-to-noise ratio (SNR) greater than a minimum level whereby computational complexity is reduced without significantly affecting performance.

6. The receiver of claim 5 wherein the digital preamble detector is configured for receiving the filtered digital signal and providing a weight vector w corresponding to the filtered digital signal; and wherein the digital symbol determination component further comprises a digital symbol estimator component for receiving the filtered digital signal and for receiving the weight vector w to provide a noise product signal $\gamma$ which is selectively sampled by the symbol synchronization signal to provide the outbound message.

7. The receiver of claim 2 wherein the A/D converter component is part of the digital processor and wherein the digital processor includes a buffering component buffering the digital message signal to sequentially provide a half-cycle signal, said buffering component including a phase locked loop (PLL) component including a phase detector, a digitally controlled oscillator (DCO) and a loop filter receiving the digital filtered signal and providing a half-cycle synchronization signal corresponding thereto, said half-cycle synchronization signal sampling the half-cycle signal to provide the corresponding digital signal.

8. The receiver of claim 1 wherein the digital preprocessor component comprises:
a fast Fourier transform (FFT) component receiving the corresponding digital signal and providing a frequency domain signal corresponding to the digital signal; and
a dimension reduction component connected to the FFT component for receiving the frequency domain signal, said dimension reduction component providing the preprocessed discretization digital signal corresponding to the received corresponding digital signal.

9. The receiver of claim 8 further comprising a finite impulse response (FIR) digital filter receiving the preprocessed discretization digital signal from the dimension reduction component and filtering the preprocessed discretization digital signal to provide the filtered digital signal to the digital symbol determination component wherein the frequency domain signal provided by the dimension reduction component to the FIR filter includes only frequency bands with a signal-to-noise ratio (SNR) greater than a minimum level whereby computational complexity is reduced without significantly affecting performance.

10. The receiver of claim 1 wherein the digital preamble detector is configured for receiving the filtered digital signal and providing a weight vector corresponding to the filtered digital signal; and wherein the digital symbol determination component further comprises a digital symbol estimator component for receiving the filtered digital signal and for receiving the weight vector to provide the noise product signal which is selectively sampled according to the symbol synchronization signal to provide the outbound message.

11. The receiver of claim 10 wherein the digital preamble detector comprises computer executable instructions on a tangible computer readable storage medium, said instructions executed by the digital processor, said instructions comprising:
a component to form a filtered preamble sequence;
a component for iteratively estimating received symbols and steering vectors;
a component for thresholding the estimated symbols; and
a component for comparing the resulting sequence to filtered preamble sequence wherein a detect indicator is set to 1 if there are fewer than a preset number of errors.

12. The receiver of claim 11 wherein adaptive equalization is implemented and further comprising estimating a noise covariance matrix for the adaptive equalization.

13. The receiver of claim 12 wherein the digital preprocessor component comprises:
a fast Fourier transform (FFT) component receiving the corresponding digital signal and providing a frequency domain signal corresponding to the digital signal; and
a dimension reduction component connected to the FFT component for receiving the frequency domain signal, said dimension reduction component providing the preprocessed discretization digital signal corresponding to the received corresponding digital signal.

14. A two-way automatic communications system (TWACS) used by an electrical utility comprising:
a substation sending analog outbound messages from the utility to a consumer;
a transponder sending inbound messages from the consumer to the utility, the respective outbound and inbound messages being sent and received over the utility's power distribution system; and
a receiver included in the transponder for enabling the detection of the outbound messages, said receiver comprising:
an analog filter component receiving the analog outbound signal including an outbound message to provide a filtered signal,
an A/D converter component converting the filtered signal to a corresponding digital signal and providing the corresponding digital signal; and
a digital processor executing:
a digital preprocessor component receiving the corresponding digital signal, preprocessing the received corresponding digital signal to provide a preprocessed discretization digital signal; and
a digital symbol determination component receiving the preprocessed discretization digital signal and providing a noise product signal, said digital symbol determination component including a preamble detector providing a symbol synchronization signal corresponding to the preprocessed discretization digital signal, said digital symbol determination component digitally demodulating the received preprocessed discretization digital signal by sampling according to the symbol synchronization signal and according to the noise product signal to provide the outbound message.

15. The system of claim 14 wherein the filter component comprises:
a carrier notch filter receiving the analog outbound signal and canceling the carrier signal to provide an analog message signal; and
a low-pass filter (LPF) component receiving the analog outbound signal and filtering the analog outbound signal to provide a filtered analog outbound signal;
and wherein the A/D converter component comprises:
a first A/D converter digitizing the analog message signal into a digital message signal; and
a second A/D converter digitizing the filtered analog outbound signal and providing a digital filtered signal.

16. The system of claim 15 wherein the digital processor includes a buffering component comprising:
a buffer receiving the digital message signal and sequentially providing a half-cycle buffered signal corresponding thereto, and
a phase locked loop (PLL) component receiving the digital filtered signal and providing a half-cycle synchronization signal corresponding thereto, said half-cycle synchronization signal sampling the half-cycle buffered signal to provide a corresponding digital signal.

17. The system of claim 14 wherein the digital preprocessor component comprises:
a fast Fourier transform (FFT) component receiving the corresponding digital signal and providing a frequency domain signal corresponding to the digital signal; and
a dimension reduction component connected to the FFT component for receiving the frequency domain signal, said dimension reduction component providing the preprocessed discretization digital signal corresponding to the received corresponding digital signal.

18. The system of claim 17 further comprising a finite impulse response (FIR) digital filter receiving the preprocessed discretization digital signal from the dimension reduction component and filtering the preprocessed discretization digital signal to provide the filtered digital signal to the digital symbol determination component wherein the frequency domain signal provided by the dimension reduction component to the FIR filter includes only frequency bands with a signal-to-noise ratio (SNR) greater than a minimum level whereby computational complexity is reduced without significantly affecting performance.

19. The system of claim 14 wherein the digital preamble detector is configured for receiving the filtered digital signal and providing a weight vector corresponding to the filtered digital signal; and wherein the digital symbol determination component further comprises a digital symbol estimator component for receiving the filtered digital signal and for receiving the weight vector to provide the noise product signal which is selectively sampled according to the symbol synchronization signal to provide the outbound message.

20. In a two-way automatic communications system (TWACS) used by an electrical utility in which analog outbound messages are sent from the utility to a consumer and inbound messages are sent from the consumer to the utility, the respective outbound and inbound messages being sent and received over the utility's power distribution system, a method for detecting the outbound messages comprising:
receiving the analog outbound signal including an outbound message;
converting the received analog outbound signal to a corresponding digital signal;
preprocessing the corresponding digital signal to provide a preprocessed discretization digital signal;
providing a noise product signal and providing a symbol synchronization signal corresponding to a preamble of the preprocessed discretization digital signal;
digitally demodulating the preprocessed discretization digital signal by sampling according to the symbol synchronization signal and according to the noise product signal to provide the outbound message.

21. The method of claim 20 wherein the receiving comprises:
filtering the analog outbound signal to cancel the carrier signal and provide an analog message signal; and
receiving the analog outbound signal and filtering the analog outbound signal to provide a filtered analog outbound signal;
and wherein the converting comprises:
digitizing the analog message signal into a digital message signal; and
digitizing the filtered analog outbound signal and providing a digital filtered signal.

22. The method of claim 21 wherein the preprocessing includes buffering comprising:
receiving the digital message signal and sequentially providing a half-cycle buffered signal corresponding thereto, and
receiving by a phase locked loop the digital filtered signal and providing a half-cycle synchronization signal corresponding thereto, said half-cycle synchronization signal sampling the half-cycle buffered signal to provide a corresponding digital signal.

23. The method of claim 22 wherein the preprocessing comprises:
receiving the corresponding digital message signal and providing a frequency domain signal corresponding to the digital signal; and
receiving the frequency domain signal and providing the preprocessed discretization digital signal corresponding to the received corresponding digital signal.

24. The method of claim 23 further comprising:
filtering the preprocessed discretization digital signal to provide the filtered digital signal wherein the frequency domain signal includes only frequency bands with a signal-to-noise ratio (SNR) greater than a minimum level whereby computational complexity is reduced without significantly affecting performance.

25. The method of claim 24 wherein the demodulating comprises:
receiving the filtered digital signal and providing a weight vector corresponding to the filtered digital signal; and
receiving the filtered digital signal and receiving the weight vector to provide the noise product signal which is selectively sampled by the symbol synchronization signal to provide the outbound message.

* * * * *